(12) United States Patent
Takeo

(10) Patent No.: US 10,714,524 B2
(45) Date of Patent: Jul. 14, 2020

(54) CIRCUIT BOARD, SEMICONDUCTOR DEVICE, IMAGING DEVICE, SOLID-STATE IMAGE SENSOR, METHOD FOR MANUFACTURING SOLID-STATE IMAGE SENSOR, AND ELECTRONIC APPARATUS

(71) Applicant: SONY CORPORATION, Tokyo (JP)

(72) Inventor: Kenji Takeo, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/086,904

(22) PCT Filed: Mar. 15, 2017

(86) PCT No.: PCT/JP2017/010300
§ 371 (c)(1),
(2) Date: Sep. 20, 2018

(87) PCT Pub. No.: WO2017/169753
PCT Pub. Date: Oct. 5, 2017

(65) Prior Publication Data
US 2019/0109168 A1 Apr. 11, 2019

(30) Foreign Application Priority Data
Mar. 29, 2016 (JP) .................. 2016-065605

(51) Int. Cl.
*H01L 27/146* (2006.01)
*H01L 21/027* (2006.01)
(Continued)

(52) U.S. Cl.
CPC ........ *H01L 27/14632* (2013.01); *G03F 7/162* (2013.01); *H01L 21/0271* (2013.01);
(Continued)

(58) Field of Classification Search
CPC .............. H01L 21/0271; H01L 27/146; H01L 27/14632; H01L 27/14687; H01L 31/02366; G03F 7/162
See application file for complete search history.

(56) References Cited

U.S. PATENT DOCUMENTS 4,659,226 A * 4/1987 Elabd ................ H01L 31/02162
250/491.1
6,030,880 A * 2/2000 Coutts ................... H01L 21/316
438/401

(Continued)

FOREIGN PATENT DOCUMENTS

CN 103367374 A 10/2013
JP 2007-005384 A 1/2007
(Continued)

OTHER PUBLICATIONS

International Search Report and Written Opinion of PCT Application No. PCT/JP2017/010300, dated Jun. 6, 2017, 10 pages of ISRWO.

*Primary Examiner* — Stephen W Smoot
(74) *Attorney, Agent, or Firm* — Chip Law Group

(57) ABSTRACT

The present disclosure relates to a circuit board, a semiconductor device, an imaging device, a solid-state image sensor, a method for manufacturing a solid-state image sensor, and an electronic apparatus that suppress a decrease in characteristics and a yield. A step portion formed on a substrate surface is configured in a divided state. With this configuration, a photoresist liquid dropped in a lithography process flows through a gap between the divided step portions so that the photoresist liquid uniformly flows on an imaging surface, whereby a decrease in characteristics and a yield due to application unevenness can be suppressed. The present disclosure can be applied to a solid-state image sensor.

13 Claims, 15 Drawing Sheets

(51) Int. Cl.
*G03F 7/16* (2006.01)
*H01L 31/0236* (2006.01)

(52) U.S. Cl.
CPC ...... *H01L 27/146* (2013.01); *H01L 27/14687* (2013.01); *H01L 31/02366* (2013.01); *H01L 21/0273* (2013.01)

(56) References Cited

U.S. PATENT DOCUMENTS 7,736,938 B2 * 6/2010 Yun .................. H01L 27/14687
　　　　　　　　　　　　　　　　　　　257/E21.527
2013/0256824 A1　10/2013 Mizuta et al.

FOREIGN PATENT DOCUMENTS

| JP | 2011-086658 A | 4/2011 |
| JP | 2013-214616 A | 10/2013 |
| WO | 2014/156657 A1 | 10/2014 |
| WO | 2015/133324 A1 | 9/2015 |

* cited by examiner

CIRCUIT BOARD, SEMICONDUCTOR DEVICE, IMAGING DEVICE, SOLID-STATE IMAGE SENSOR, METHOD FOR MANUFACTURING SOLID-STATE IMAGE SENSOR, AND ELECTRONIC APPARATUS

CROSS REFERENCE TO RELATED APPLICATIONS

This application is a U.S. National Phase of International Patent Application No. PCT/JP2017/010300 filed on Mar. 15, 2017, which claims priority benefit of Japanese Patent Application No. JP 2016-065605 filed in the Japan Patent Office on Mar. 29, 2016. Each of the above-referenced applications is hereby incorporated herein by reference in its entirety.

TECHNICAL FIELD

The present disclosure relates to a circuit board, a semiconductor device, an imaging device, a solid-state image sensor, a method for manufacturing a solid-state image sensor, and an electronic apparatus. In particular, the present disclosure relates to a circuit board, a semiconductor device, an imaging device, a solid-state image sensor, a method for manufacturing a solid-state image sensor, and an electronic apparatus in which a decrease in characteristics is suppressed and a decrease in a yield is suppressed.

BACKGROUND ART

In recent years, there is known a back irradiation complementary metal-oxide semiconductor (CMOS) image sensor having a layered structure in which a circuit board on which a drive circuit is formed is prepared in addition to a sensor board on which a photoelectric converter is formed and the circuit board is bonded to a surface opposite to a light receiving surface of the sensor board.

In such a CMOS image sensor, the layered structure is formed by connecting a surface of a wiring layer of the sensor board and a surface of a wiring layer of the circuit board. Furthermore, a connecting part for electrically connecting the sensor board and the circuit board is provided. In the connecting part, a through via hole that penetrates a semiconductor layer of the sensor board and is connected to the wiring layer of the sensor board and another through via hole that penetrates the sensor board and is connected to the wiring layer of the circuit board are connected to each other by a wiring part formed on an upper part of the light receiving surface of the semiconductor layer of the sensor board. Furthermore, a color filter and an on-chip lens corresponding to each pixel are provided on the light receiving surface side of the semiconductor layer of the sensor board.

Here, the shorter a distance between the color filter and the photoelectric converter becomes, the better sensitivity and a color mixing characteristic becomes. Furthermore, a thickness of the semiconductor layer on the light receiving surface side (length in a direction perpendicular to the sensor board) is preferably small in order to relax restriction of a circuit wiring and an alignment mark, stress of the sensor board, and the like. Accordingly, a thickness of a region around the wiring part is made thinner than the wiring part, and the wiring part forms a step on the light receiving surface side of the semiconductor layer. As a result, in a case where the color filter is applied after the formation of the wiring part, coating unevenness of the color filter is caused due to the step.

Furthermore, with respect to a solid-state imaging device such as a front irradiation CMOS image sensor and a charge coupled device (CCD) image sensor as well, in a case where a wiring part is formed around a region on a semiconductor substrate where a pixel is formed in such a manner that a thickness of the wiring part is larger than that of the region, coating unevenness of the color filter is caused due to the step of the wiring part.

In view of the above, a technique in which a corner portion to be an end region of a step structure is made to have a curvature shape has been proposed (see Patent Document 1) as a method for suppressing resist application unevenness (above-described coating unevenness) caused by the step structure disposed around an imaging region of the back irradiation CMOS image sensor.

Moreover, in the technique disclosed in the Patent Document 1, the shape of the corner portion is not limited to the curvature shape, and it is also proposed to make, by adding an obtuse angle corner, the corner portion to have an obtuse shape or a shape of a combination of a rounded and obtuse angles.

Moreover, a technique in which an application unevenness is reduced by disposing a through chip via (TCV) in only one direction in a longitudinal or lateral direction and reducing an area of a step region has been proposed (see Patent Document 2).

CITATION LIST

Patent Document

Patent Document 1: International Publication No. 2014/156657
Patent Document 2: International Publication No. 2015/133324

SUMMARY OF THE INVENTION

Problems to be Solved by the Invention

Incidentally, a stacked CMOS image sensor (CIS) includes a CIS substrate and a logic substrate, and the substrates are connected by a through hole called a through silicon via (TSV). The TSV is formed after the two substrates are bonded and thinned. The TSV is formed mainly at a position around an imaging region of the CIS substrate. The TSV bored by etching is plated with a highly conductive material such as Cu. In order to prevent diffusion of these materials on a wafer surface, the TSV is covered with a film such as SiON and SiN.

The cover film is removed since it is unnecessary for a layered structure of the imaging region. As a result, the step structure corresponding to the cover film thickness is formed in the region where the TSV is formed. Since the step exists adjacent to the imaging region, resist coating unevenness due to the step structure is caused in a resist coating process in a lithography process after a TSV forming process.

In the technique disclosed in Patent Document 1, countermeasures against the coating unevenness such as applying the curvature shape to the corner portion and reducing a height of the step are carried out.

However, according to the techniques disclosed in Patent Documents 1 and 2, the effect of suppressing the application unevenness is not sufficient enough, and there is a risk that device characteristics are impaired and a yield is decreased.

The present disclosure is conceived in view of such a situation, and in particular, a decrease in characteristics is suppressed and a decrease in a yield is suppressed by reducing application unevenness caused by a step.

Solutions to Problems

A solid-state image sensor according to an aspect of the present disclosure is a solid-state image sensor, in which a step structure on a substrate surface is in a divided state.

The step structure on the substrate surface can be in a state divided into the same shape.

The step structure in the divided state can include a gap of a predetermined width.

The predetermined width of the gap can be larger than 0.2 in a case where a size of the divided step structure in a planar direction is set to 1.

The step structure in the divided state can be geometrically disposed with the predetermined width of the gap with respect to one predetermined axial direction.

The step structure in the divided state can be geometrically disposed with the predetermined width of the gap with respect to the one predetermined axial direction in such a manner that, in a case where fluid is dropped onto the substrate surface in a state where a wafer on which a plurality of solid-state image sensors is formed is rotated so that the fluid flows on the substrate surface, fluid velocities varied by the gap due to the step structure are cancelled out as a whole.

A plurality of the step structures in the divided state can be geometrically disposed on a two-dimensional plane with the predetermined width of the gap with respect to the one predetermined axial direction.

The plurality of step structures in the divided state can be geometrically disposed on the two-dimensional plane with the predetermined width of the gap with respect to the one predetermined axial direction in such a manner that, in a case where fluid is dropped onto the substrate surface in a state where a wafer on which the plurality of solid-state image sensors is formed is rotated so that the fluid flows on the substrate surface, fluid velocities varied by the gap due to the step structure are cancelled out as a whole.

A size of the step structure in the divided state in a substrate planar direction can be smaller than 100 μm.

Film thickness/height as a ratio between a film thickness of the fluid and a height of the substrate at a time when the fluid is dropped onto the substrate surface in the state where the wafer on which the plurality of solid-state image sensors is formed is rotated so that the fluid flows on the substrate surface can be smaller than 5.

A method for manufacturing the solid-state image sensor according to an aspect of the present disclosure is a method for manufacturing a solid-state image sensor, in which a step structure on a substrate surface is in a divided state.

An imaging device according to an aspect of the present disclosure is an imaging device in which a step structure on a substrate surface is in a divided state.

An electronic apparatus according to an aspect of the present disclosure is an electronic apparatus in which a step structure on a substrate surface is in a divided state.

A semiconductor device according to an aspect of the present disclosure is a semiconductor device in which a step structure on a substrate surface is in a divided state.

A circuit board according to an aspect of the present disclosure is a circuit board in which a step structure on a substrate surface is in a divided state.

According to an aspect of the present disclosure, a step structure on a substrate surface is in a divided state.

Effects of the Invention

According to an aspect of the present disclosure, application unevenness is reduced, whereby a decrease in characteristics can be suppressed and a decrease in a yield can be suppressed.

MODE FOR CARRYING OUT THE INVENTION

Hereinafter, a preferred embodiment of the present disclosure will be described in detail with reference to the accompanying drawings. Note that, in the present specification and the drawings, constituent elements having substantially the same functional configuration will be denoted by the same reference signs, and duplicate descriptions thereof will be omitted.

<Mechanism of Ocurrence of Photoresist Application Unevenness>

In describing a configuration of a solid-state image sensor to which the technology of the present disclosure is applied, first, a mechanism by which above-described application unevenness of a photoresist occurs will be described.

The application unevenness of the photoresist occurs in a lithography process.

The lithography process is a process for forming a pattern in which a photoresist layer is formed on a wafer including a large number of solid-state image sensors before dicing, the photoresist layer corresponding to a pattern is peeled off by an exposure using an ultraviolet ray or the like, and the part in which the photoresist layer is peeled off is dissolved in a developer or the like.

Figure 1:
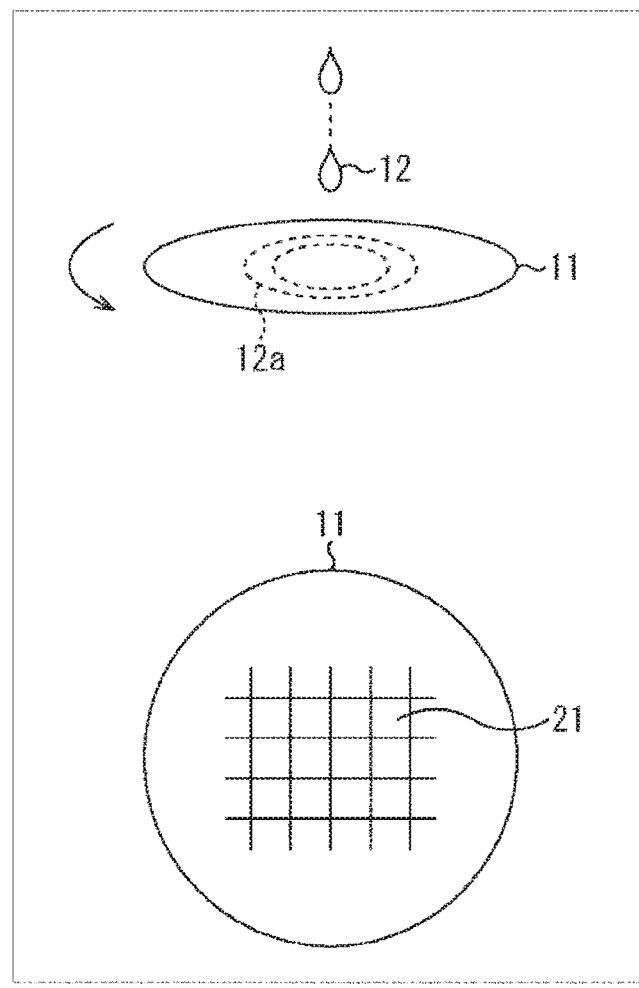
FIG. 1 is a diagram illustrating a mechanism by which an application unevenness of a photoresist occurs.

More specifically, as illustrated in the upper part of FIG. 1, for example, in a case where a photoresist 12 including a viscous liquid is dropped onto the upper surface of a disk-shaped wafer 11 being rotated in the direction of the arrow, the photoresist 12 spreads thinly from the rotation center toward the outer circumference of the wafer 11 due to the centrifugal force generated by the rotating wafer 11, thereby forming a photoresist layer 12a.

As illustrated in the lower part of FIG. 1, a plurality of square solid-state image sensors 21 is formed on the wafer 11, and the photoresist layer 12a is formed throughout.

Figure 2:
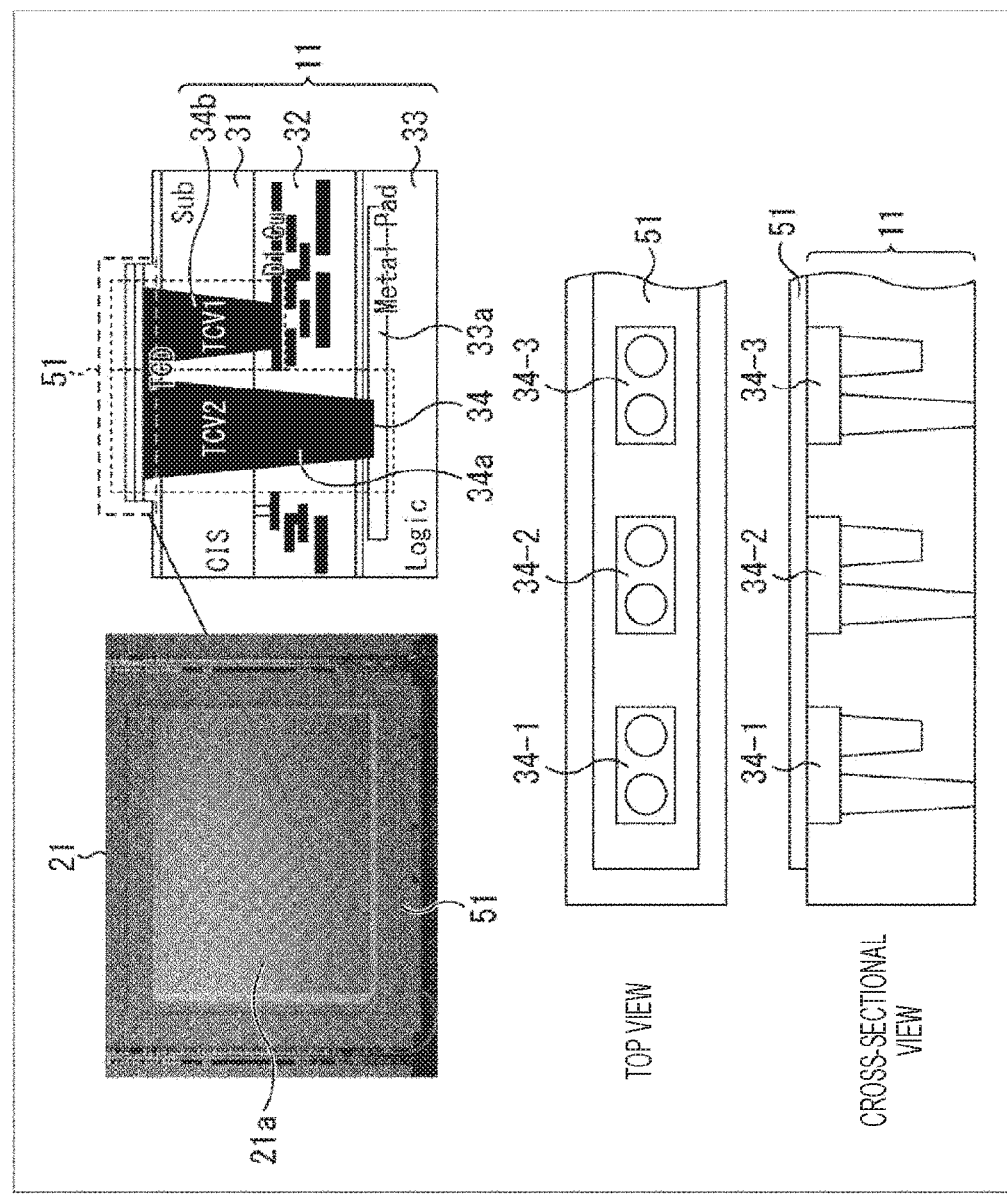
FIG. 2 is a diagram illustrating a configuration of a conventional cavity.

Incidentally, as illustrated in the upper left part of FIG. 2, the plurality of square solid-state image sensors 21 formed on the wafer 11 connects a wiring layer and a logic layer to surround a square imaging surface 21a, through silicon vias (TSVs) having different depths are disposed, and a cavity 51 is formed to cover the TSV. The cavity 51 prevents diffusion of a material such as Cu on a wafer surface with respect to the TSV plated with a highly conductive material such as Cu, and includes a film such as SiON and SiN.

As illustrated in the side sectional view of the upper right part of FIG. 2, the solid-state image sensor 21 includes a photoelectric conversion layer 31, a wiring layer 32, and a logic layer 33. Here, wiring of the wiring layer 32 and a metal pad 33a of the logic layer 33 are electrically connected via an electrode 34. The electrode 34 has a structure in which a TSV 34b that is a terminal including a through hole from a surface layer to the wiring of the wiring layer 32 and a TSV 34a that is a terminal including a through hole from the surface layer to the metal pad 33a of the wiring layer 33 are connected at a surface layer part.

The electrodes 34 are disposed at a predetermined pitch to surround the imaging surface 21a. The electrode 34 includes Cu, and as described above, a surface thereof is protected by the cavity 51 to prevent the electrode 34 including Cu being exposed to the surface layer part. As illustrated in the lower part of FIG. 2, the cavity 51 is formed in such a manner that electrodes 34-1, 34-2, 34-3, and the like disposed linearly at the predetermined pitch, which include gaps between the electrodes, are surrounded by the cavity 51 and the imaging surface 21a is surrounded in a square shape by the cavity 51, thereby protecting the surface so that Cu does not become exposed to the surface layer.

However, as described above, the photoresist 12 is dropped onto the wafer 11 in a state where the plurality of solid-state image sensors 21 formed in this manner is disposed. Here, in each solid-state image sensor 21, the cavity 51 is formed to surround the imaging surface 21a. Under the influence of the step generated by the cavity 51, for example, as illustrated in FIG. 3, unevenness occurs with respect to a thickness of the photoresist layer 12a.

Figure 3:
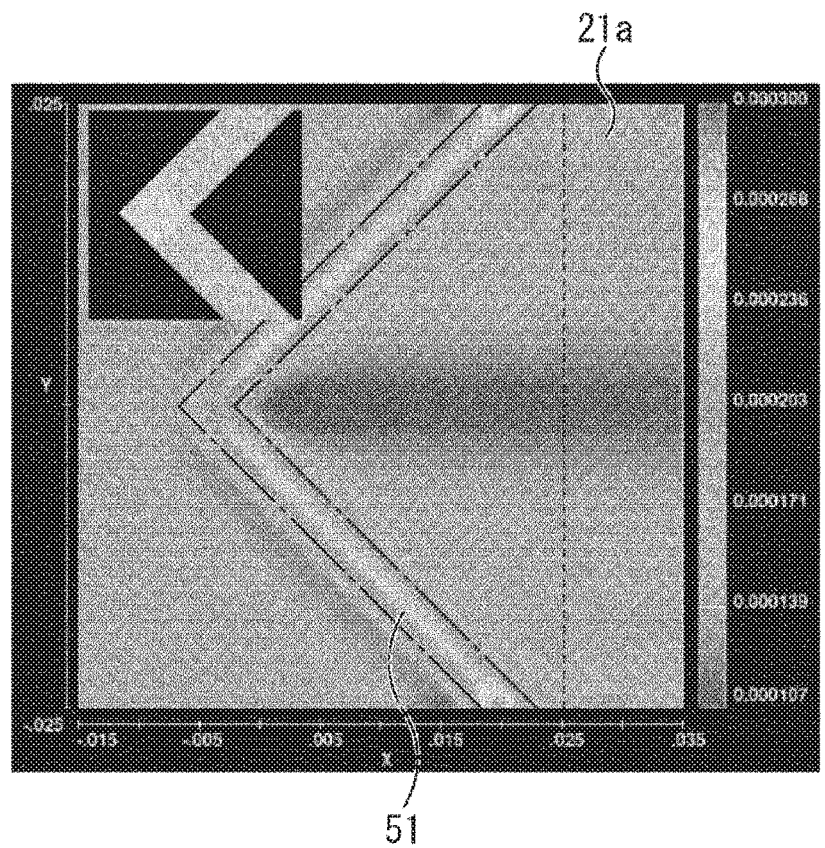
FIG. 3 is a view illustrating the application unevenness of the photoresist.

Note that FIG. 3 illustrates a surface of the solid-state image sensor 21 including the imaging surface 21a, and is a distribution map illustrating a flow velocity distribution of the photoresist 12 around the imaging surface 21a using color density in a case where the cavity 51 is formed at a corner portion (corner portion protruding leftward in the drawing) and the photoresist 12 flows from the left side of the drawing due to the centrifugal force. The flow velocity is high at a deep-colored portion while the flow velocity is low at a light-colored portion.

As illustrated in FIG. 3, while a high-velocity region is generated in a region on the imaging surface 21a in the right direction from the corner of the cavity 51 positioned at the center part in the vertical direction in the drawing, the flow velocity is low in the upper and lower parts in the drawing away from the center part in the vertical direction in the drawing. Accordingly, unevenness of the flow velocity occurs, whereby the application unevenness occurs and the thickness unevenness of the photoresist layer 12a occurs.

As a result, unevenness in a layer thickness of the photoresist layer 12a occurs due to the application unevenness of the photoresist 12 caused by the cavity 51, whereby there have been risks that characteristics of the solid-state image sensor 21 are impaired and a yield is decreased.

Since it is known that the cavity 51 adversely affects the solid-state image sensor 21 as described above, conventionally, a structure in which a height of the cavity 51 is reduced as much as possible is employed.

Figure 4:
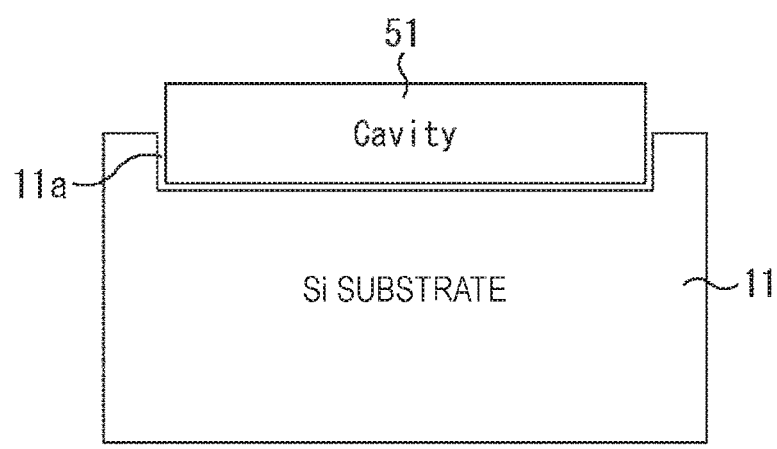
FIG. 4 is another diagram illustrating the configuration of the conventional cavity.

However, since there is a limit to simply reducing the height of the cavity 51, for example, as illustrated in FIG. 4, the technique in which a dug portion 11a is formed in the region on the upper surface of the wafer 11 where the cavity 51 is formed and the cavity is formed on the dug portion 11a, which aims to further reduce the height, has also been proposed.

<Structure of Cavity According to Present Disclosure>

As described above, it is known that the application unevenness is caused due to the structure of the cavity 51. Accordingly, in the solid-state image sensor 21 according to the present disclosure, instead of the dike-like cavity 51 illustrated in the upper left part of FIG. 5, cavities 61-1 to 61-n configured by dividing the cavity 51 at a predetermined pitch with respect to the vertical and horizontal directions are employed as illustrated in the upper right part of FIG. 5. Note that, in a case where the cavities 61-1 to 61-n do not need to be distinguished individually, it will simply be referred to as a cavity 61 hereafter, and other configurations will be referred to similarly.

Figure 5:
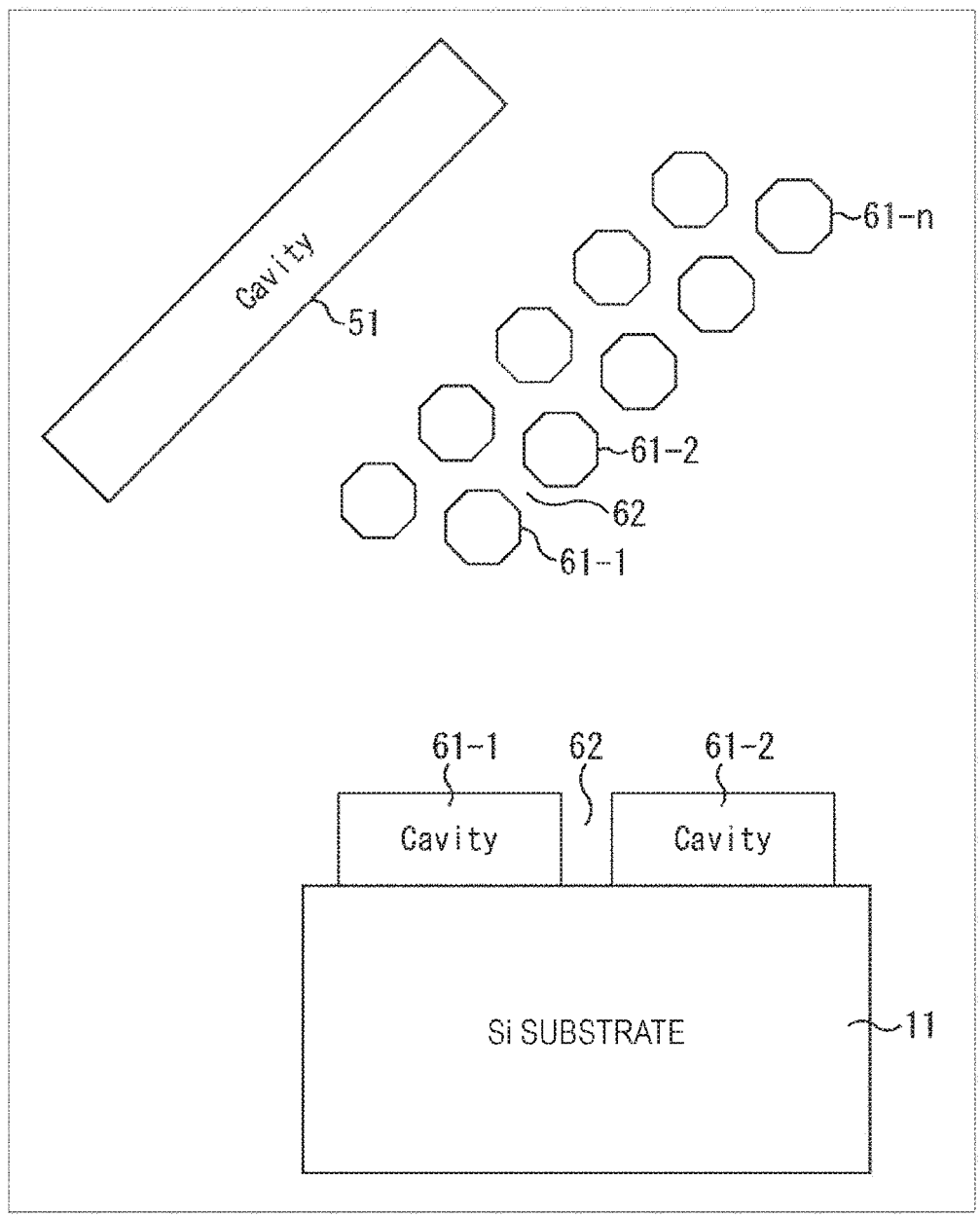
FIG. 5 is a diagram illustrating a configuration of a cavity to which the technology of the present disclosure is applied.

In other words, as illustrated in the lower part of FIG. 5, a gap 62 between the cavities 61-1 and 61-2 that allows the photoresist 12 to flow is formed at the predetermined pitch by disposing the cavities 61-1 to 61-n configured by dividing the cavity 51 to surround the imaging surface 21a at the predetermined pitch, whereby the flow of the photoresist 12 can be dispersed and the occurrence of the application unevenness can be suppressed.

More specifically, the cavity 61 is provided to individually cover Cu on the surface layer of each electrode 34 in FIG. 2. Accordingly, the electrode 34 is disposed to surround the imaging surface 21a of the solid-state image sensor 21 to correspond to the arrangement of the cavity 61, and the cavity 61 is provided to individually cover the disposed electrode 34. Alternatively, the cavity 61 is provided to cover the several disposed electrodes 34.

Figure 6:
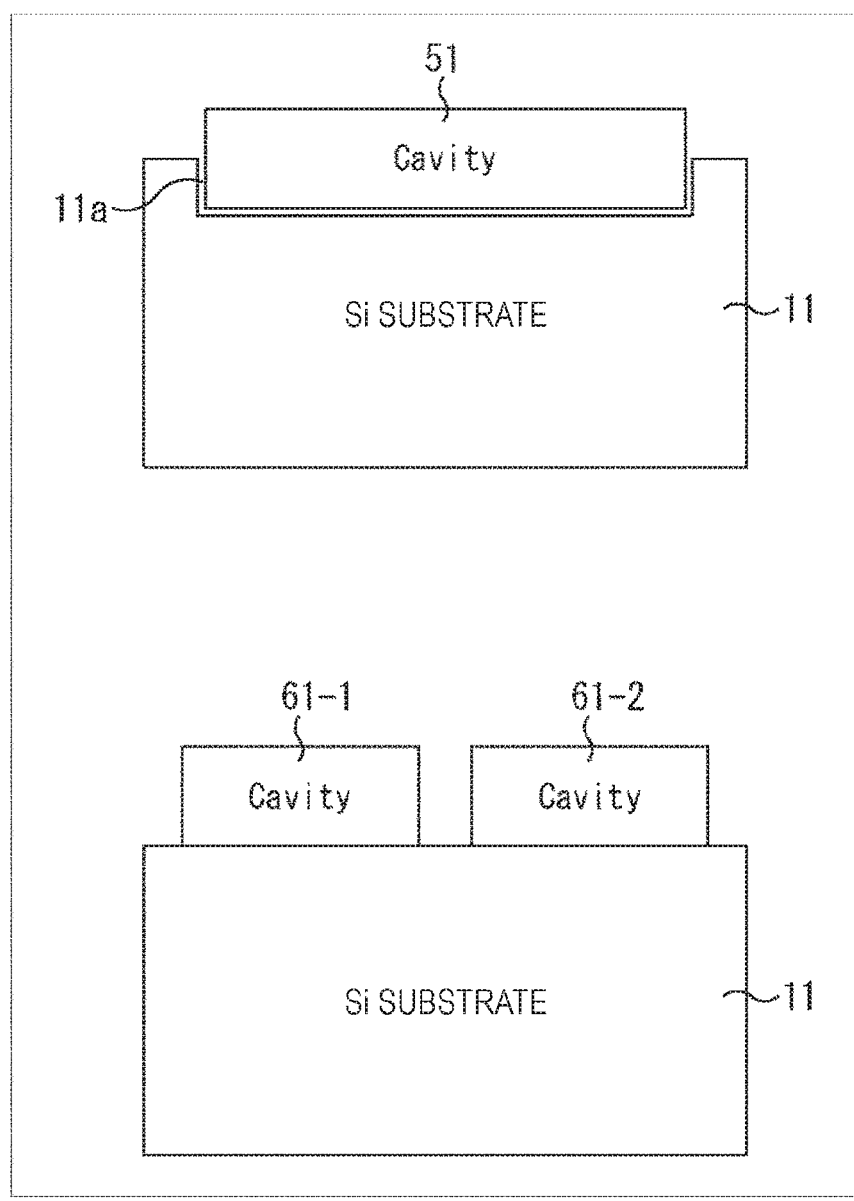
FIG. 6 is another diagram illustrating the configuration of the conventional cavity.

Furthermore, as illustrated in the upper part of FIG. 6, a process for forming the dug portion 11a has been necessary in a case where the cavity 51 is formed by forming the dug portion 11a. Meanwhile, as illustrated in the lower part of FIG. 6, the process for forming the dug portion 11a becomes unnecessary by using the cavities 61-1 to 61-n configured by dividing the cavity 51, and it is only necessary to perform forming on the surface layer of the wafer 11, whereby the number of steps can be reduced.

Figure 7:
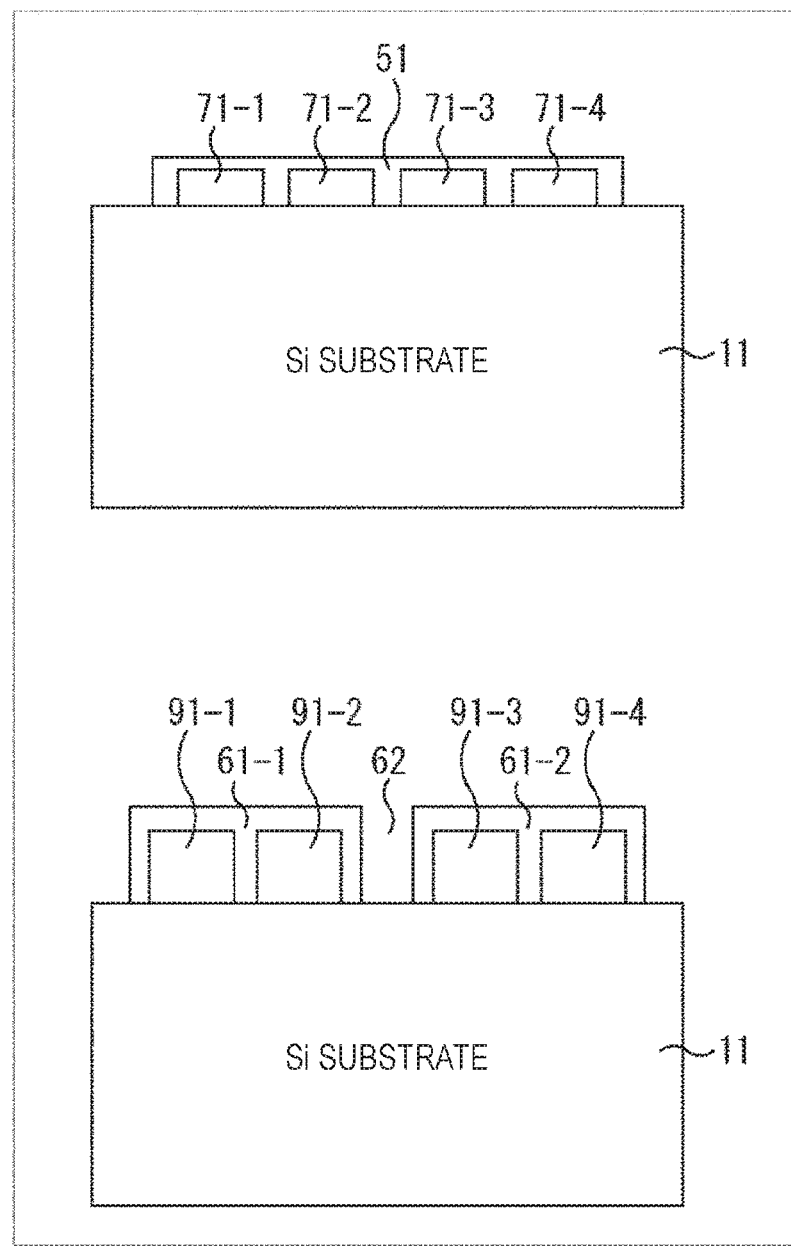
FIG. 7 is diagram illustrating an effect of the cavity in FIG. 5.

Moreover, as illustrated in the upper part of FIG. 7, it has been essential to reduce the height of the cavity 51 even in a case where wirings 71-1 to 71-4 are formed inside the cavity 51. Accordingly, sectional areas of the wirings 71-1 to 71-4 are made smaller so that the wiring resistance becomes large, which may result in an increase in power consumption and heat generation.

Meanwhile, in the case of the cavities 61-1 to 61-$n$, the flow of the photoresist 12 can be generated in a case where the gap 62 is formed between the cavities 61 so that the restriction with respect to the height reduction can be relaxed. Accordingly, as illustrated in the lower part of FIG. 7, wirings 91-1 to 91-$n$ having sectional areas larger than the wirings 71-1 to 71-$n$ can be formed so that the wiring resistance can reduced, whereby the power consumption can be reduced and the heat generation can be reduced.

<Reduction of Application Unevenness Due to Cavity According to Present Disclosure>

Figure 8:
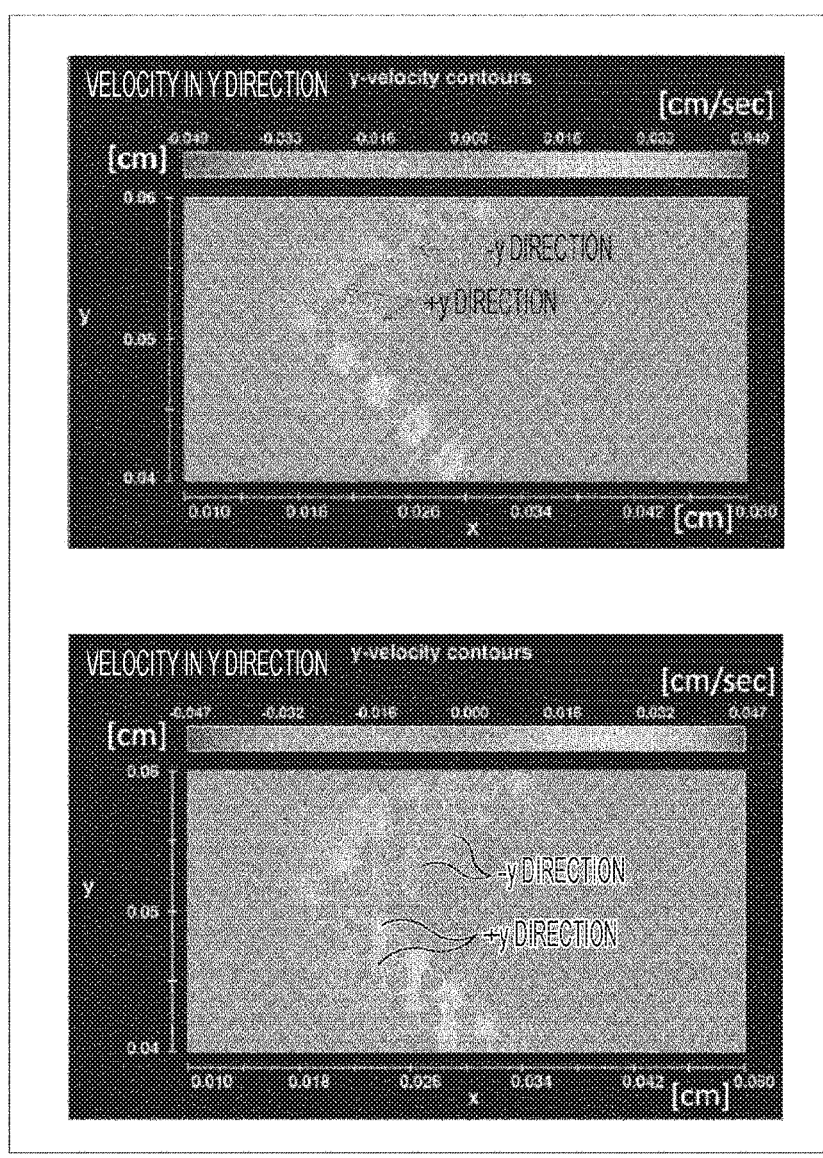
FIG. 8 is a view illustrating a distribution of a flow velocity of a photoresist flowing through a gap of the cavity in FIG. 5.

FIG. 8 illustrates a flow velocity distribution of the photoresist 12 in a y direction (vertical direction in the drawing) at the corner portion of the imaging surface 21$a$ with the cavities 61-1 to 61-$n$ instead of the cavity 51. In FIG. 8, a state in which the photoresist 12 is flowing from the left to the right in the drawing is illustrated, and the flow velocity at a region with a lighter color is higher, while the flow velocity at a region with a deeper color is lower. Furthermore, the upper part of FIG. 8 exemplifies a case where the cavities 61-1 to 61-$n$ are aligned and disposed in a square shape as a whole, and the lower part of FIG. 8 exemplifies a case where another alignment of the cavities is disposed in addition to the arrangement of the cavities 61-1 to 61-$n$ in the upper part of FIG. 8 so that a total of two rows of the cavities 61-1 to 61-$n$ are disposed.

As illustrated in the upper part of FIG. 8, in the upper left part and the lower right part of each cavity 61, a region in which the flow velocity becomes high is generated in the positive y direction in a case where the upward direction is positive with respect to the y axis that is the vertical direction in the drawing. Furthermore, in the upper right portion and the lower left portion of each cavity 61, a region in which the flow velocity becomes high is generated in the negative y direction in a case where the upward direction is positive with respect to the y axis that is the vertical direction in the drawings.

As a result, the region in which the flow velocity becomes high in the positive y direction and the region in which the flow velocity becomes high in the negative y direction adjacent to each other are generated in a vertically alternate manner so that the flow velocities cancel out each other and the flows are canceled out as a whole, whereby no flow unevenness is generated in the right direction in the drawing in which the imaging surface 21$a$ that is the downstream of the flow, which is provided with the cavities 61-1 to 61-$n$, exists.

Similarly, in the lower part of FIG. 8 as well, the region in which the flow velocity becomes high in the positive y direction and the region in which the flow velocity becomes high in the negative y direction adjacent to each other are generated in a vertically alternate manner so that the flow velocities cancel out each other and the flows are canceled out as a whole, whereby no flow unevenness is generated in the right direction in the drawing in which the imaging surface 21$a$ that is the downstream of the flow, which is provided with the cavities 61-1 to 61-$n$, exists.

That is, as illustrated in FIG. 8, in a case where the cavities 61-1 to 61-$n$ are disposed to surround the imaging surface 21$a$, that is, in a case where the cavities 61-1 to 61-$n$ are disposed linearly with the gap having the predetermined width, in other words, the cavities are geometrically disposed in such a manner that, although the region in the region in the vicinity of the cavities 61-1 to 61-$n$ in which different flows occur is generated, the flows are canceled out as a whole, whereby the occurrence of the application unevenness on the imaging surface 21$a$ is suppressed.

Furthermore, as illustrated in the lower part of FIG. 8, the cavities 61-1 to 61-$n$ are linearly disposed with the gap having the predetermined pitch with respect to the predetermined direction even in a case where the cavities are in the plurality of rows, and the plurality of cavities is disposed on a two-dimensional plane, in other words, in this case as well, the cavities are disposed in such a manner that, although the region in the region in the vicinity of the cavities 61-1 to 61-$n$ in which different flows occur is generated, the flows are canceled out as a whole, whereby the occurrence of the application unevenness can be suppressed.

<Dependence on Division Width of Cavity for Application Unevenness Reduction>

Next, dependence on a division width of the cavities 61-1 to 61-$n$ for the purpose of reducing the application unevenness will be described with reference to FIGS. 9 and 10.

Figure 9:
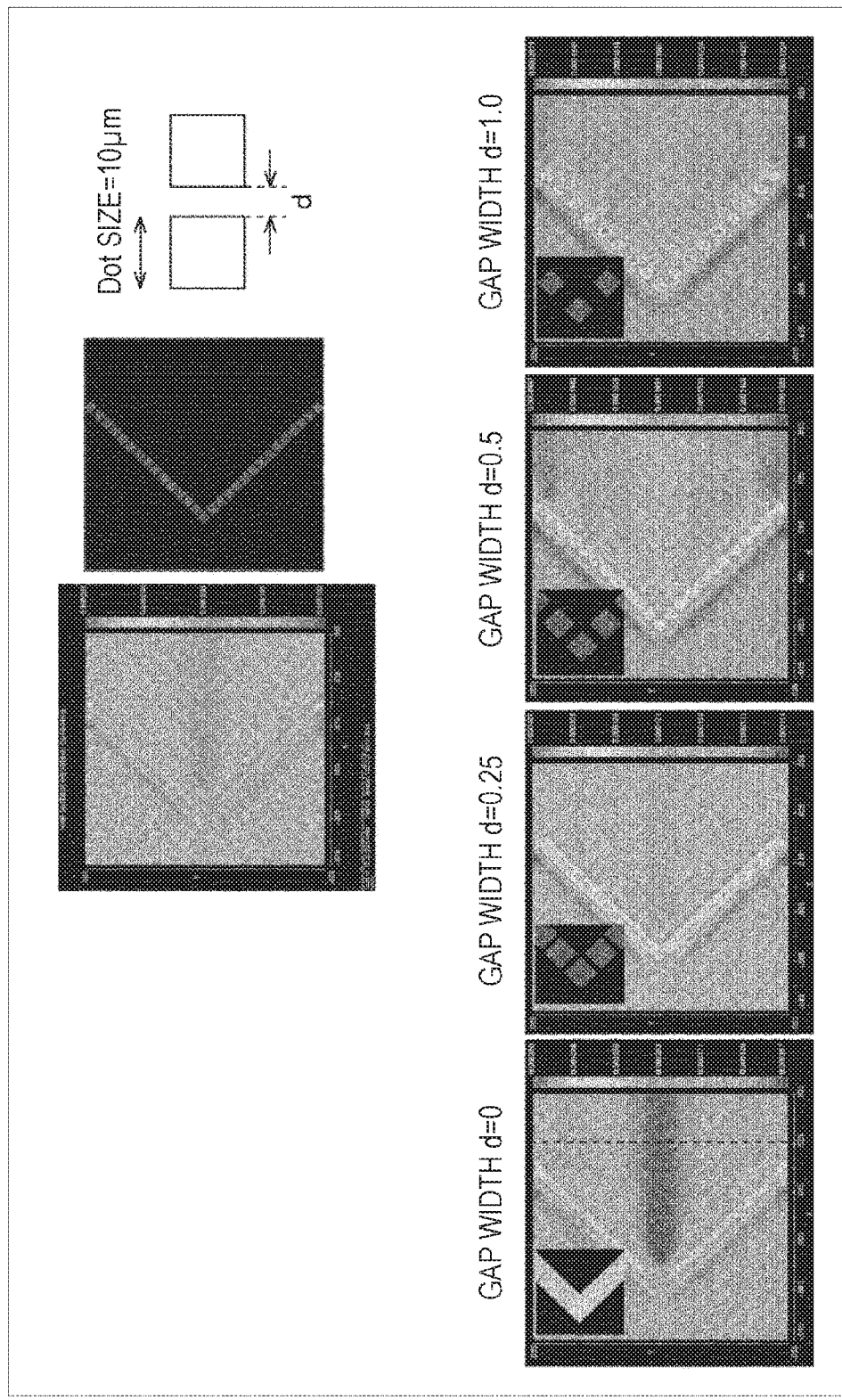
FIG. 9 is a view illustrating dependence on a pitch of a gap between the cavities for reducing the application unevenness.

The lower part of FIG. 9 illustrates a flow velocity distribution in a case where the square cavity 61 of 10 μm×10 μm is disposed to surround the imaging surface 21$a$ as illustrated in the upper part in FIG. 9 and the photoresist 12 is flowed from the left to the right in the drawing by varying, within a range protruding leftward in the vicinity of the corner portion of the imaging surface 21$a$, a gap width d between the cavities 61 to four kinds in a case where the width of the cavity 61 is set to 1, and illustrates the flow velocity distribution in a case where the cavity 61 is disposed at the pitch of satisfying, from the left, the gap width d=0, 0.25, 0.5, and 1.0. In the lower part of FIG. 9 as well, the flow velocity is lower at a region with a deeper color, while the flow velocity is higher at a region with a lighter color.

As illustrated in the lower leftmost part in FIG. 9, the case of the gap width d=0 is a case with a row in which the cavity 61 is disposed similar to the case of the conventional cavity 51, and the region with the flow velocity higher than the periphery is generated at a center position in the vertical direction in the drawing from the position corresponding to the corner portion of the imaging surface 21$a$ and on the right side in the drawing, whereby the application unevenness may be caused.

Meanwhile, with respect to the gap width in the three types of the gap width d=0.25, 0.5, and 1.0 on the right side from the second from the left in the lower part of the drawing, a uniform flow velocity distribution is illustrated in the region on the right side of the range in which the cavity 61 is disposed in the drawing and the imaging surface 21$a$ should exists therein, which indicates that the risk of the application unevenness generation is reduced.

Figure 10:
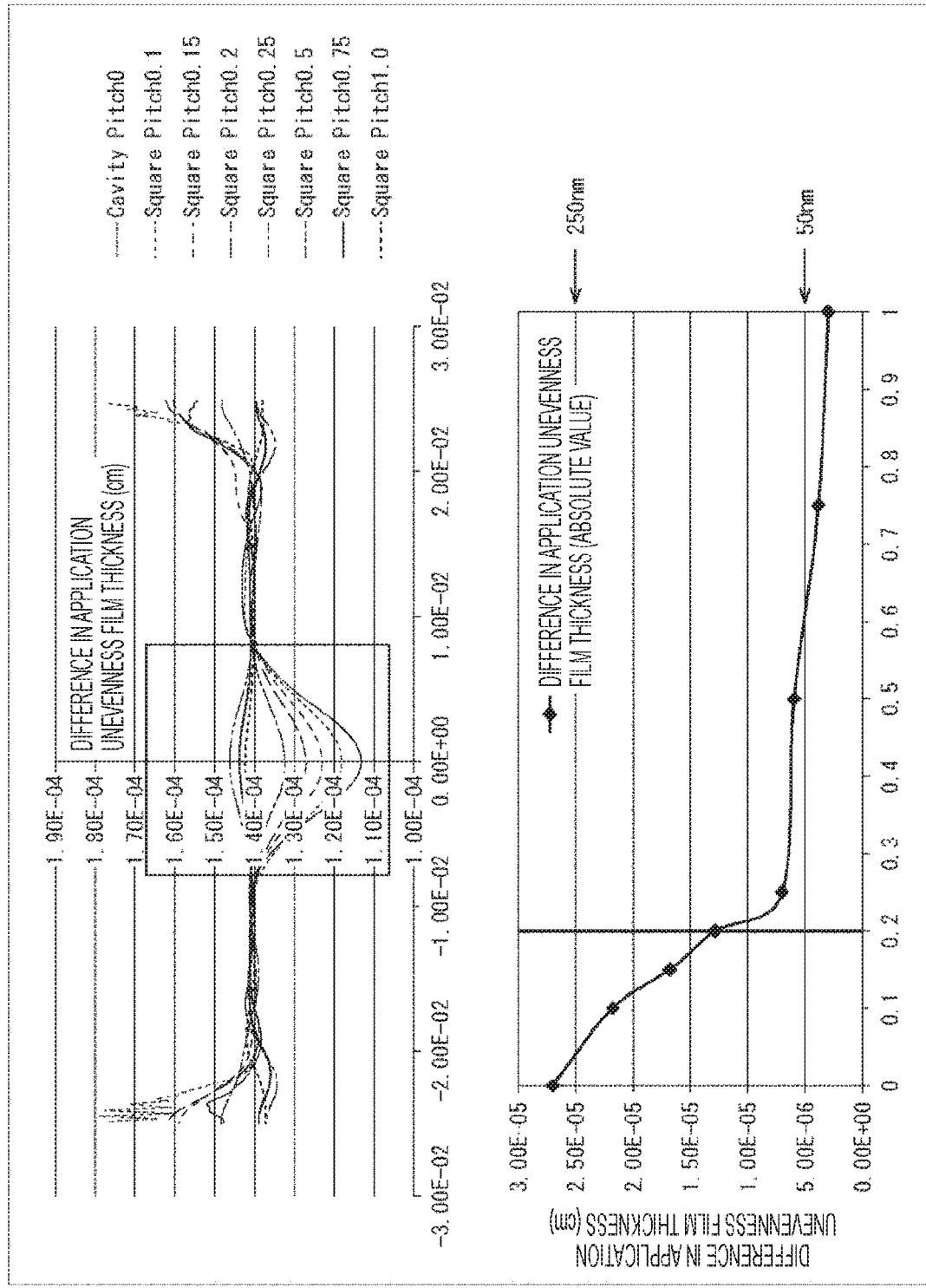
FIG. 10 is a chart illustrating the dependence on the pitch of the gap between the cavities for reducing the application unevenness.

Furthermore, the upper part of FIG. 10 illustrates a difference in application unevenness film thickness at the position indicated by the dotted line, which is in the region illustrated in the lower leftmost part in FIG. 9 in a case where the gap width d is varied to eight kinds of values of 0, 0.1, 0.15, 0.2, 0.25, 0.5, 0.75, and 1.0. Moreover, the lower part of FIG. 10 illustrates an absolute value distribution of the difference in application unevenness film thickness in the upper part of FIG. 10 with respect to the gap width d.

As illustrated in the upper and lower parts of FIG. 10, in the range in which the gap width d is smaller than a predetermined value (e.g., range smaller than the case of d=0.2), in the imaging surface 21a that is the range on the right side in the drawing, the region in which the flow velocity becomes lower than that in the periphery is generated so that the photoresist 12 is difficult to flow in the region in which the flow velocity becomes lower, and the like, whereby the film thickness of the photoresist film 12a corresponding to the region is made thin, and the difference in application unevenness film thickness tends to be large.

Furthermore, in the range in which the gap width d is larger than the predetermined value (e.g., range larger than the case of the gap width d=0.2), in the imaging surface 21a that is the range on the right side in the drawing, the flow velocity distribution becomes substantially uniform, whereby the absolute value of the difference in application unevenness film thickness tends to converge to a predetermined value (e.g., about 50 nm).

In view of such a tendency, in a case where the gap width d is larger than about 0.2, the occurrence of the application unevenness is considered to be substantially suppressed. Accordingly, by configuring the cavity 61 such that the gap width d becomes larger than 0.2, a decrease in imaging characteristics caused by the application unevenness is suppressed and a decrease in a yield can be suppressed.

<Dependence on Division Shape of Cavity for Application Unevenness Reduction>

Next, dependence on a division shape of the cavity for reducing the application unevenness will be described with reference to FIG. 11.

Figure 11:
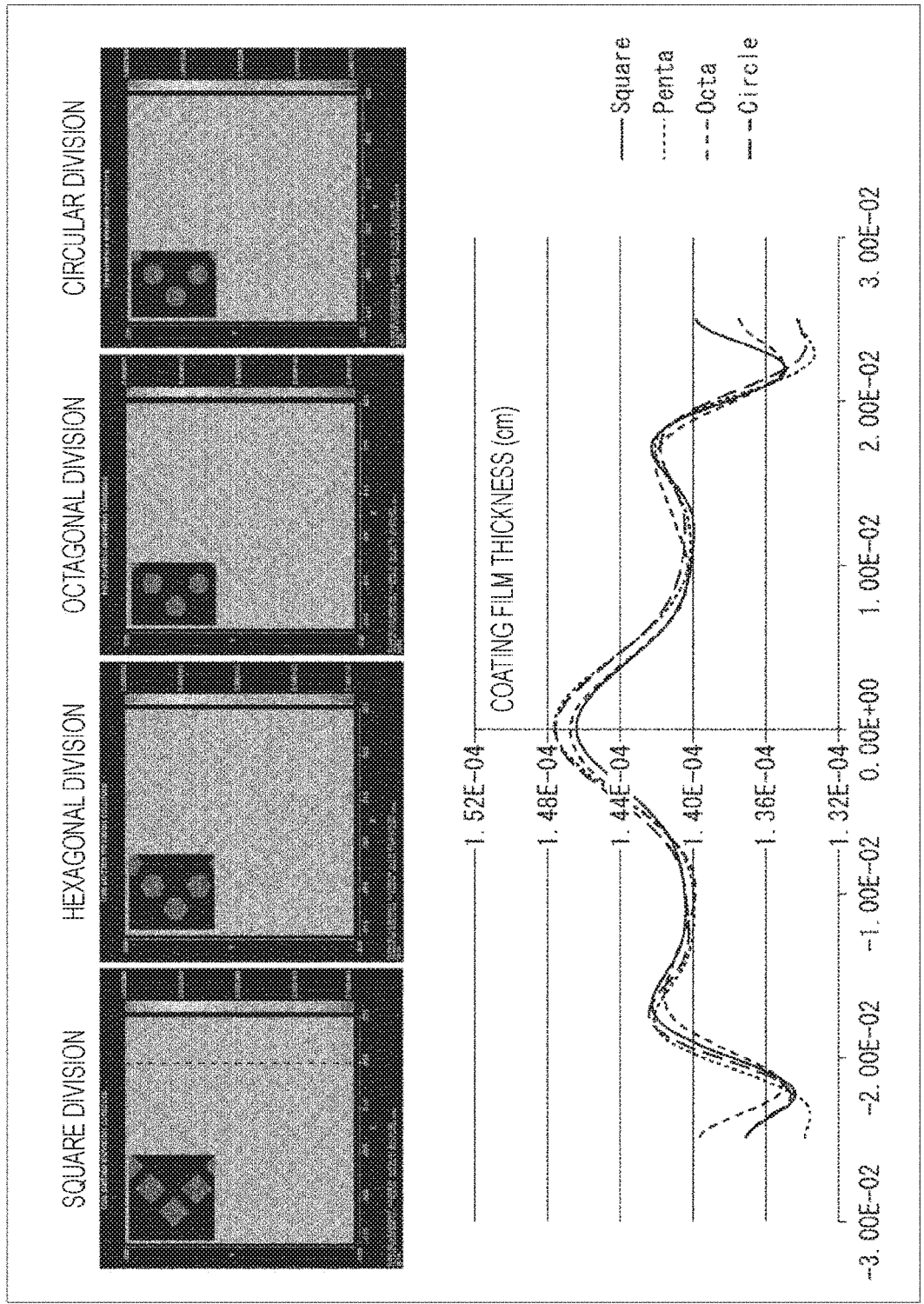
FIG. 11 is a chart illustrating dependence on a shape of the cavity for reducing the application unevenness.

The upper part of FIG. 11 illustrates a flow velocity distribution in a case where the gap width d is kept constant and a planer shape of the cavity 61 is, from the left in the drawing, square (Square), hexagonal (Penta), octagonal (Octa), and circular (Circle). Furthermore, the lower part of FIG. 11 illustrates a coating film thickness distribution of the respective photoresist layers 12a in the range of the imaging surface 21a indicated by the dotted line in the upper left part of FIG. 11.

In other words, the upper and lower parts of FIG. 11 indicate that the flow velocity distribution and the coating film thickness distribution are substantially the same in any planer shape.

As a result, a change in the planar shape of the cavity 61 is considered to exert no influence.

<Dependence on Pattern Size of Application Unevenness Reduction Effect by Pattern Division>

Next, dependence on a size in the substrate planar direction for reducing the application unevenness according to a pattern division method in a case where the ratio between the coating film thickness of the resist and the height of the cavity step is kept constant by varying viscosity of the photoresist liquid will be described with reference to FIG. 12.

Figure 12:
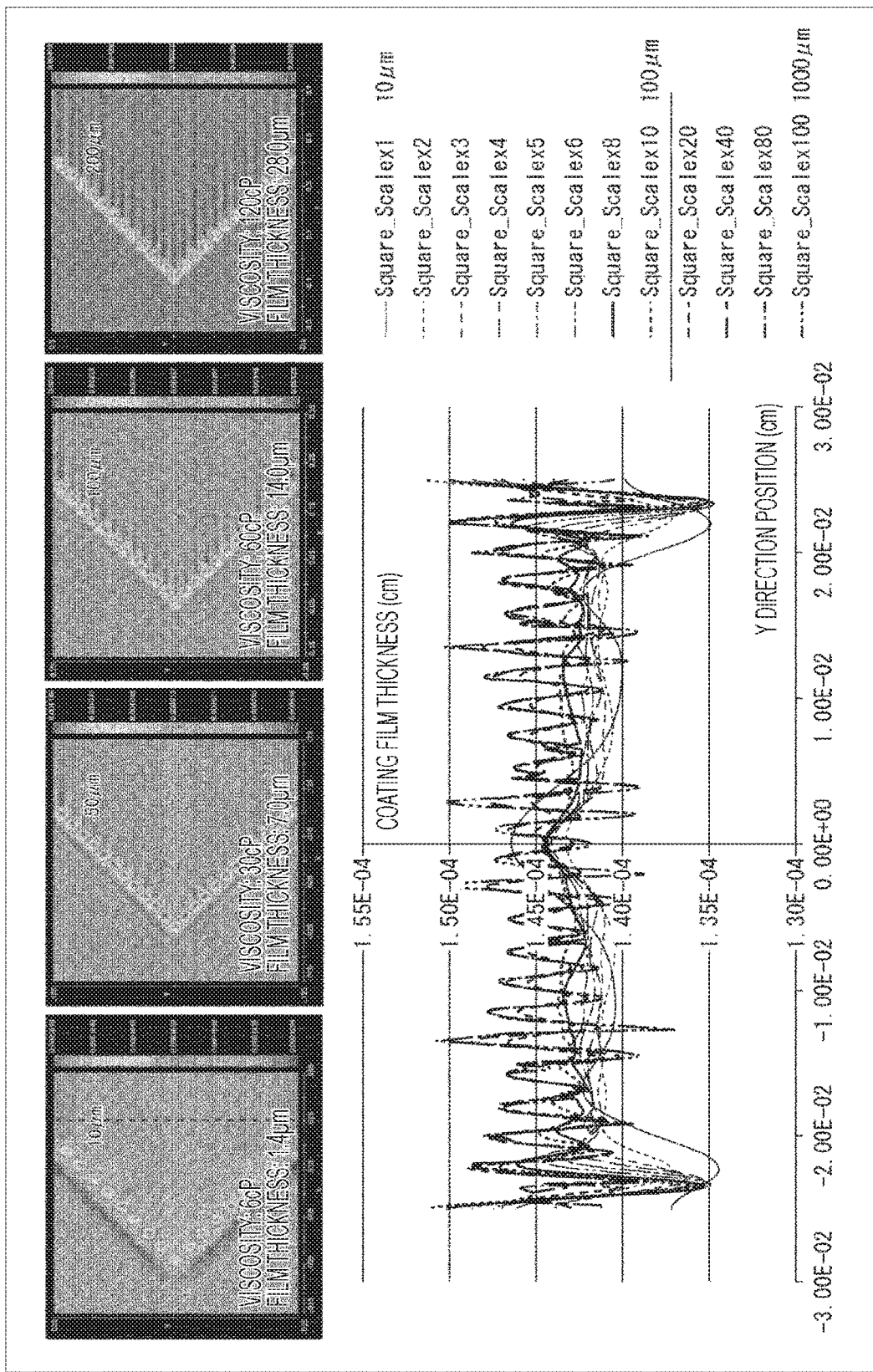
FIG. 12 is a chart illustrating dependence on a size of the cavity for reducing the application unevenness.

The upper part of FIG. 12 illustrates a flow velocity distribution in a case substantially similar to the case where the size of the cavity 61 is varied to 10 μm×10 μm (Square_Scale×1), 50 μm×50 μm (Square_Scale×5), 100 μm×100 μm (Square_Scale×10), and 200 μm×200 μm (Square_Scale×20) by varying the viscosity of the photoresist 12 to 6 cP, 30 cP, 60 cP, and 120 cP with respect to the cavity 61 of 10 μm×10 μm.

Furthermore, the lower part of FIG. 12 illustrates a coating film thickness distribution at the position corresponding to the dotted line portion indicated by the upper leftmost part of FIG. 12 in a case where substantially the size of the cavity 61 is varied to 10 μm×10 μm (Square_Scale×1), 20 μm×20 μm (Square_Scale×2), 30 μm×30 μm (Square_Scale×3), 40 μm×40 μm (Square_Scale×4), 50 μm×50 μm (Square_Scale×5), 60 μm×60 μm (Square_Scale×6), 80 μm×80 μm (Square_Scale×8), 100 μm×100 μm (Square_Scale×10), 200 μm×200 μm (Square_Scale×20), 400 μm×400 μm (Square_Scale×40), 800 μm×800 μm (Square_Scale×80), and 1000 μm×1000 μm (Square_Scale×100), respectively, by varying the viscosity of the photoresist 12 with respect to the cavity 61 of 10 μm×10 μm.

In other words, as illustrated in the distribution in the leftmost part, the second from the left, and the third from the left in the upper part of FIG. 12, the flow velocity distribution is kept uniform throughout the region on the imaging surface 21a right side of the range in which the cavity 61 is provided substantially up to the vicinity of the size of about 100 μm×100 μm (Square_Scale×10) with respect to the size of the cavity 61. Meanwhile, as illustrated in the upper rightmost part of FIG. 12, the flow velocity distribution is not in the uniform state with stripes in the lateral direction throughout the region on the imaging surface 21a right side of the range in which the cavity 61 is provided in the case of the size of 200 μm×200 μm (Square_Scale×20).

Furthermore, as illustrated in the lower part of FIG. 12, the coating film thickness converges to a predetermined thickness and is stabilized on the imaging surface 21a right side of the range in which the cavity 61 is provided substantially up to the vicinity of the size of about 100 μm×100 μm (Square_Scale×10) with respect to the size of the cavity 61. Meanwhile, as illustrated in the lower part of FIG. 12, in a case where the size becomes larger than 100 μm×100 μm (Square_Scale×10), the coating film thickness enters an unstable wavy state throughout the region in the vertical direction (Y direction) in the drawing on the imaging surface 21a right side of the range in which the cavity 61 is provided.

As a result, in a case where the viscosity of the photoresist 12 is varied, the coating film thickness converges to a predetermined thickness and is stabilized on the imaging surface 21a right side of the range in which the cavity 61 is provided substantially up to the vicinity of the size of about 100 μm×100 μm (Square_Scale×10) with respect to the size of the cavity 61, whereby optical characteristics of the imaging sensor are maintained and a decrease in a yield can be suppressed.

<Dependence on Pattern Size of Application Unevenness Reduction Effect by Pattern Division>

Next, dependence on the size in the substrate planar direction for reducing the application unevenness according to the pattern division method in a case where the ratio between the coating film thickness of the resist and the height of the cavity step is kept constant by varying acceleration level of flowing the photoresist 12 will be described with reference to FIG. 13.

Figure 13:
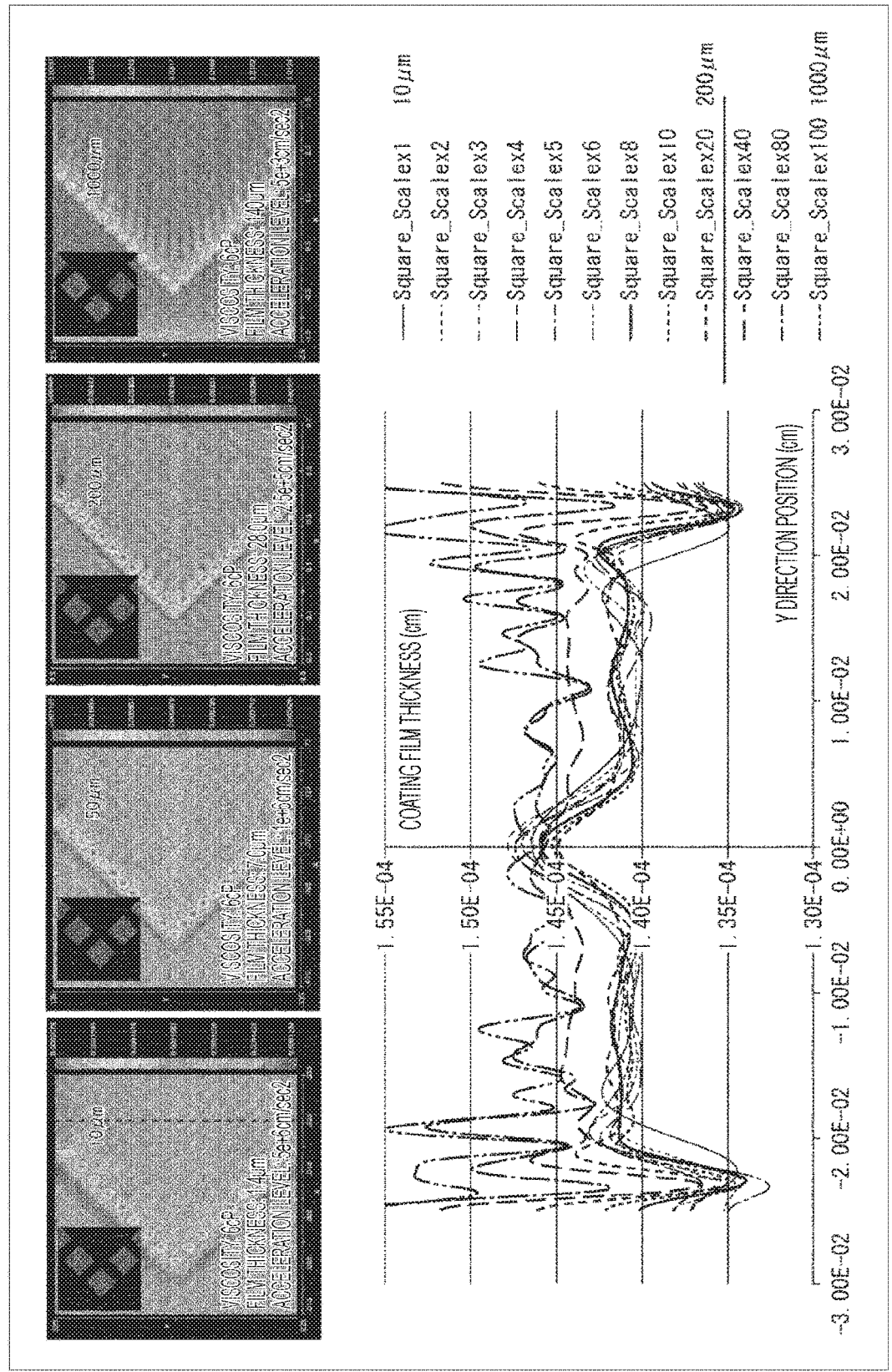
FIG. 13 is another chart illustrating the dependence on the size of the cavity for reducing the application unevenness.

The upper part of FIG. 13 illustrates a flow velocity distribution in a case substantially similar to the case where the size of the cavity 61 is varied to 10 μm×10 μm (Square_Scale×1), 50 μm×50 μm (Square_Scale×5), 200 μm×200 μm (Square_Scale×20), and 1000 μm×1000 μm (Square_Scale×100) by varying the acceleration level of flowing the photoresist 12 to $5 \times 10^6$ cm/sect, $1 \times 10^6$ cm/sect, $2.5 \times 10^5$ cm/sect, and $5 \times 10^3$ cm/sect with respect to the cavity 61 of 10 μm×10 μm.

Furthermore, the lower part of FIG. 13 illustrates a coating film thickness distribution at the position corresponding to the dotted line portion indicated by the upper leftmost part of FIG. 13 in a case where substantially the size of the cavity 61 is varied to 10 µm×10 µm (Square_Scale×1), 20 µm×20 µm (Square_Scale×2), 30 µm×30 µm (Square_Scale×3), 40 µm×40 µm (Square_Scale×4), 50 µm×50 µm (Square_Scale×5), 60 µm×60 µm (Square_Scale×6), 80 µm×80 µm (Square_Scale×8), 100 µm×100 µm (Square_Scale×10), 200 µm×200 µm (Square_Scale×20), 400 µm×400 µm (Square_Scale×40), 800 µm×800 µm (Square_Scale×80), and 1000 µm×1000 µm (Square_Scale×100), respectively, by varying the acceleration level of flowing the photoresist 12 with respect to the cavity 61 of 10 µm×10 µm.

In other words, as illustrated in the distribution in the leftmost part, the second from the left, and the third from the left in the upper part of FIG. 13, the flow velocity distribution is kept uniform throughout the region on the imaging surface 21a right side of the range in which the cavity 61 is provided substantially up to the vicinity of the size of about 200 µm×200 µm (Square_Scale×20) with respect to the size of the cavity 61. Meanwhile, as illustrated in the upper rightmost part of FIG. 13, the flow velocity distribution is not in the uniform state with stripes in the lateral direction throughout the region on the imaging surface 21a right side of the range in which the cavity 61 is provided in the case of the size of 1000 µm×1000 µm (Square_Scale×100).

Furthermore, as illustrated in the lower part of FIG. 13, the coating film thickness converges to a predetermined thickness and is stabilized on the imaging surface 21a right side of the range in which the cavity 61 is provided substantially up to the vicinity of the size of about 200 µm×200 µm (Square_Scale×10) with respect to the size of the cavity 61. Meanwhile, as illustrated in the lower part of FIG. 13, in a case where the size becomes larger than 200 µm×200 µm (Square_Scale×20), the coating film thickness enters an unstable wavy state throughout the region in the vertical direction (Y direction) in the drawing on the imaging surface 21a right side of the range in which the cavity 61 is provided.

As a result, in a case where the acceleration level of flowing the photoresist 12 is varied, the coating film thickness converges to a predetermined thickness and is stabilized on the imaging surface 21a right side of the range in which the cavity 61 is provided substantially up to the vicinity of the size of about 200 µm×200 µm (Square_Scale×20) with respect to the size of the cavity 61, whereby optical characteristics of the imaging sensor are maintained and a decrease in a yield can be suppressed.

In this manner, in the case of varying the viscosity of the photoresist 12, the flow velocity distribution of the photoresist 12 is stabilized up to the vicinity of the size of about 100 µm×100 µm (Square_Scale×10) with respect to the size of the cavity 61, and in the case of varying the acceleration level of flowing the photoresist 12, the flow velocity distribution of the photoresist 12 is stabilized up to the vicinity of the size of about 200 µm×100 µm (Square_Scale×20) with respect to the size of the cavity 61.

Taking these results together, in a case where the viscosity and the acceleration level of the photoresist 12 are varied, it can be said that the flow velocity distribution of the photoresist 12 is stabilized up to the vicinity of the size of about 100 µm×100 µm (Square_Scale×10) with respect to the size of the cavity 61 in the substrate planar direction.

<Dependence on Ratio Between Cavity Step Height and Coating Film Thickness for Application Unevenness Reduction Obtained by Varying Acceleration Level of Flowing Photoresist>

Next, dependence on the ratio between the height of the cavity step and the coating film thickness for reducing the application unevenness obtained by varying the acceleration level of making the photoresist 12 flow will be described with reference to FIG. 14.

Figure 14:
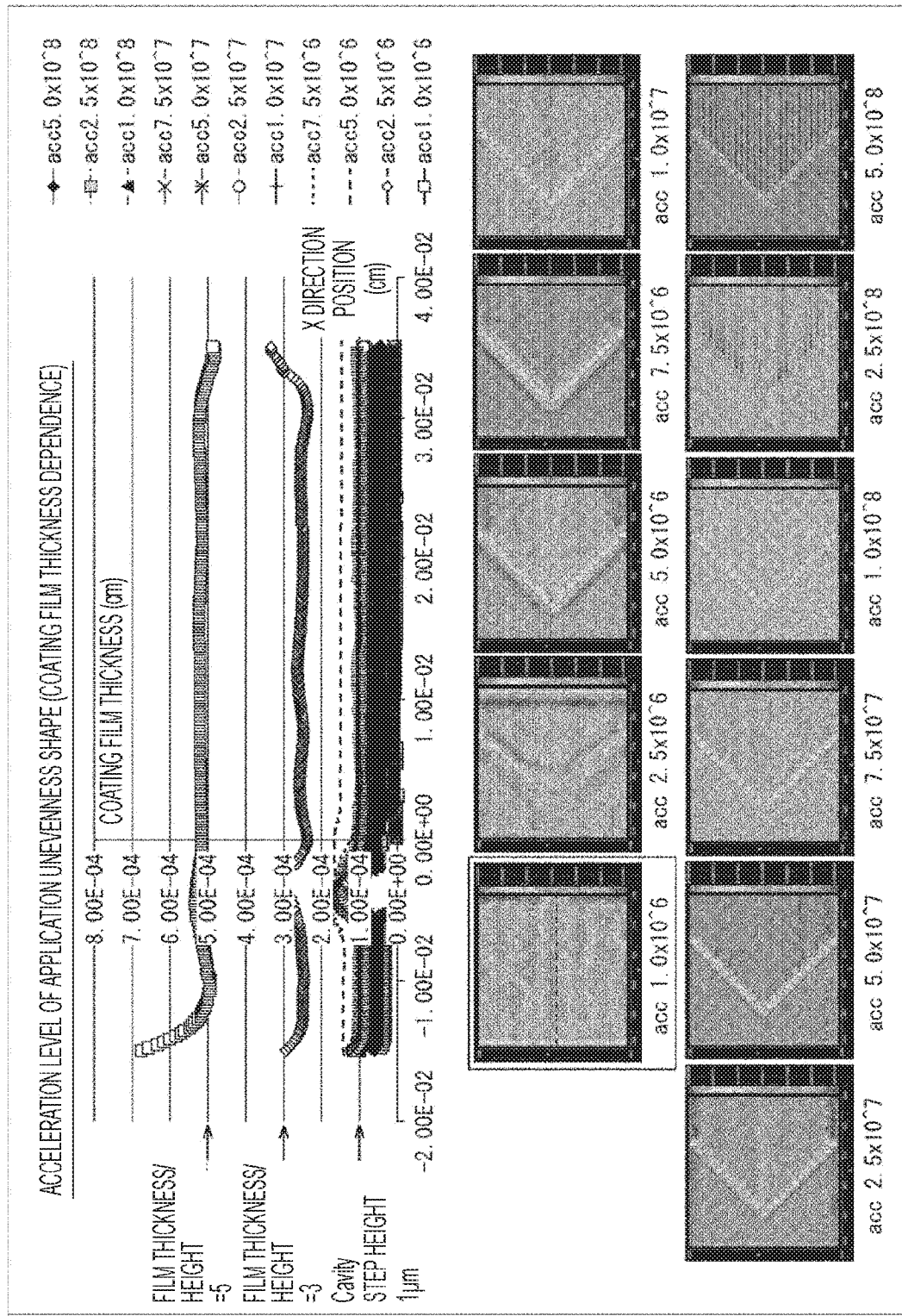
FIG. 14 is a chart illustrating dependence on a ratio between a height of the cavity for reducing the application unevenness and a film thickness of the photoresist.

The upper part of FIG. 14 illustrates a height of the coating film thickness in the horizontal direction indicated by the dotted line in the upper leftmost part of the lower part of FIG. 14 in a case where the photoresist 12 flows by varying the acceleration level from the left to the right in the drawing at the corner portion in which the cavity 61 having the step height of the film thickness of 1 µm is linearly disposed around the imaging surface 21a at a predetermined pitch in the lower part of FIG. 14. Furthermore, the lower part of FIG. 14 illustrates a flow velocity distribution for each acceleration level of making the photoresist 12 flow.

Here, the acceleration level is, in order from the upper leftmost part to the right of the lower part of FIG. 14, $1.0 \times 10^6$ cm/sec$^2$ (acc 1.0×10^6), $2.5 \times 10^6$ cm/sec$^2$ (acc 2.5× 10^6) $5.0 \times 10^6$ cm/sec$^2$ (acc 5.0×10^6), $7.5 \times 10^6$ cm/sec$^2$ (acc 7.5×10^6), $1.0 \times 10^7$ cm/sec$^2$ (acc 2.5×10^7), $2.5 \times 10^7$ cm/sec$^2$ (acc 2.5×10^7), $5.0 \times 10^7$ cm/sec$^2$ (acc 5.0×10^7), $7.5 \times 10^7$ cm/sec$^2$ (acc 7.5×10^7), $1.0 \times 10^8$ cm/sec$^2$ (acc 2.5×10^8), $2.5 \times 10^8$ cm/sec$^2$ (acc 2.5×10^8), and $5.0 \times 10^8$ cm/sec$^2$ (acc 5.0×10^8), and the lower part of FIG. 14 illustrates the flow velocity distribution for each acceleration level.

Furthermore, the upper part of FIG. 14 illustrates the height of the coating film thickness for each acceleration level described above.

As a result, as illustrated in the upper leftmost part of the lower part of FIG. 14, in the flow velocity distribution of the case where the acceleration level of the photoresist 12 is $1.0 \times 10^6$ cm/sec$^2$ (acc 1.0×10^6), an outer shape of the application unevenness is not present and an effect of the cavity 61 is considered to be low.

Meanwhile, as illustrated in the examples on the upper right side from the second from the left in the lower part of FIG. 14, in the examples in which the acceleration level of the photoresist 12 is larger than the acceleration level of $2.5 \times 10^6$ cm/sec$^2$ (acc 2.5×10^6), the outer shape of the application unevenness is present on the imaging surface 21a, and the effect of the cavity 61 is generated.

Accordingly, in a case where the acceleration level of the photoresist 12 is larger than the acceleration level of $1.0 \times 10^6$ cm/sec$^2$ (acc 1.0×10^6), the effect of the cavity 61 can be considered to be generated. Here, in the upper part of FIG. 14, the coating film thickness of a case where the acceleration level of the photoresist 12 is $1.0 \times 10^6$ cm/sec$^2$ (acc 1.0×10^6) is about 5 µm. Furthermore, the step height of the cavity 61 is 1 µm in this case. Accordingly, the film thickness/height (cavity step height) is five (=5 µm/1 µm). In other words, with respect to the film thickness/height (cavity step height), the effect of the cavity 61 can be considered to be exerted in a case where the film thickness/height is smaller than 5.

As a result, by making the film thickness/height smaller than 5 with respect to the film thickness/height, the coating film thickness can be set to a predetermined thickness on the imaging surface 21a right side of the range in which cavity 61 is provided, whereby a decrease in optical characteristics of the imaging sensor are suppressed and a decrease in a yield can be suppressed.

Note that, although the exemplary case to be applied to the solid-state image sensor 21 has been described above, with a semiconductor device, a circuit board, and the like having a configuration in which a step such as a cavity is generated on a surface layer or the like on which a photoresist layer is formed in a lithography process, a similar effect can be exerted through a similar process. In other words, in addition to the solid-state image sensor 21, with a semiconductor device, a circuit board, and the like having a configuration in which a step such as a cavity is generated on a surface layer or the like on which a photoresist layer is formed in a lithography process, occurrence of the application unevenness of the photoresist layer can be suppressed by forming the step in the divided state, whereby a decrease in a yield and a decrease in characteristics due to the application unevenness can be suppressed.

<Exemplary Application to Electronic Apparatus>

The solid-state image sensor 21 described above can be applied to various electronic apparatuses such as an imaging device such as a digital still camera and a digital video camera, a mobile phone having an imaging function, and other devices having an imaging function.

Figure 15:
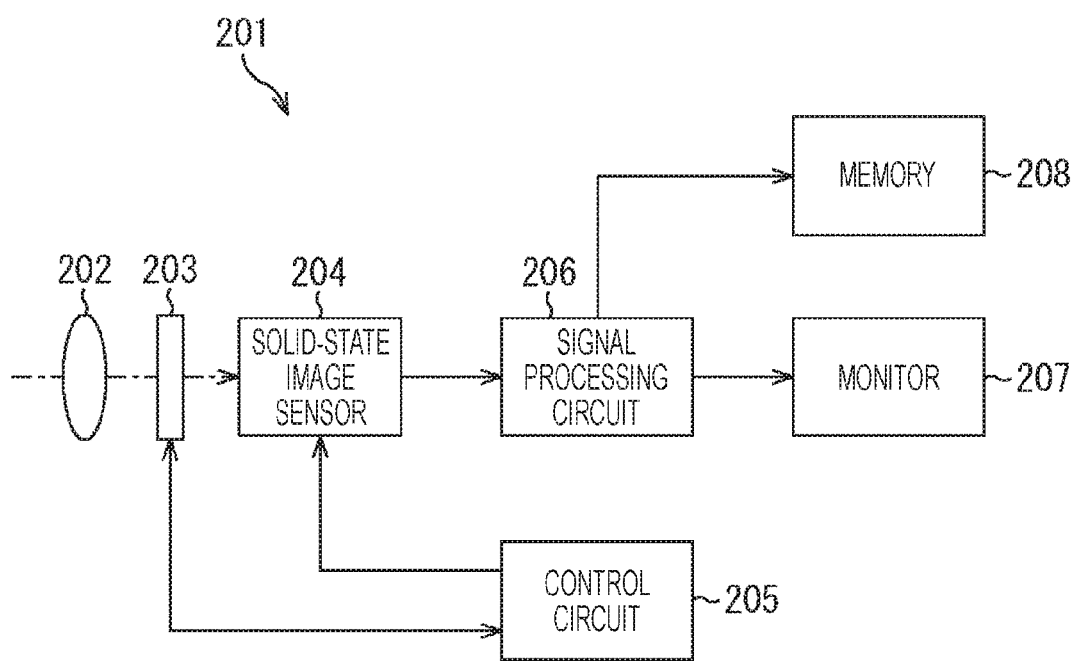
FIG. 15 is a block diagram illustrating an exemplary configuration of an imaging device as an electronic apparatus to which the present technology is applied.

FIG. 15 is a block diagram illustrating an exemplary configuration of an imaging device as an electronic apparatus to which the present technology is applied.

An imaging device 201 illustrated in FIG. 15 includes an optical system 202, a shutter device 203, a solid-state image sensor 204, a drive circuit 205, a signal processing circuit 206, a monitor 207, and a memory 208, and is capable of capturing a still image and a moving image.

The optical system 202 includes one or a plurality of lenses, guides light (incident light) from an object to the solid-state image sensor 204, and forms an image on a light receiving surface of the solid-state image sensor 204.

The shutter device 203 is disposed between the optical system 202 and the solid-state image sensor 204, and controls a light irradiation period and a light shading period with respect to the solid-state image sensor 204 under control of a drive circuit 1005.

The solid-state image sensor 204 includes a package including the above-described solid-state image sensor. The solid-state image sensor 204 accumulates signal charges for a certain period of time in accordance with the light for forming an image on the light receiving surface via the optical system 202 and the shutter device 203. The signal charges accumulated in the solid-state image sensor 204 are transmitted in accordance with a drive signal (timing signal) supplied from the drive circuit 205.

The drive circuit 205 outputs the drive signal for controlling transfer operation of the solid-state image sensor 204 and shutter operation of the shutter device 203, thereby driving the solid-state image sensor 204 and the shutter device 203.

The signal processing circuit 206 performs various signal processing on the signal charge output from the solid-state image sensor 204. An image (image data) obtained by applying the signal processing performed by the signal processing circuit 206 is supplied to the monitor 207 and displayed, or supplied to the memory 208 and stored (recorded).

In the imaging device 201 having the above-described configuration as well, by applying the solid-state image sensor 21 in place of the solid-state image sensor 204 described above, a decrease in characteristics and a decrease in a yield can be suppressed.

<Exemplary Use of Solid-State Image Sensor>

Figure 16:
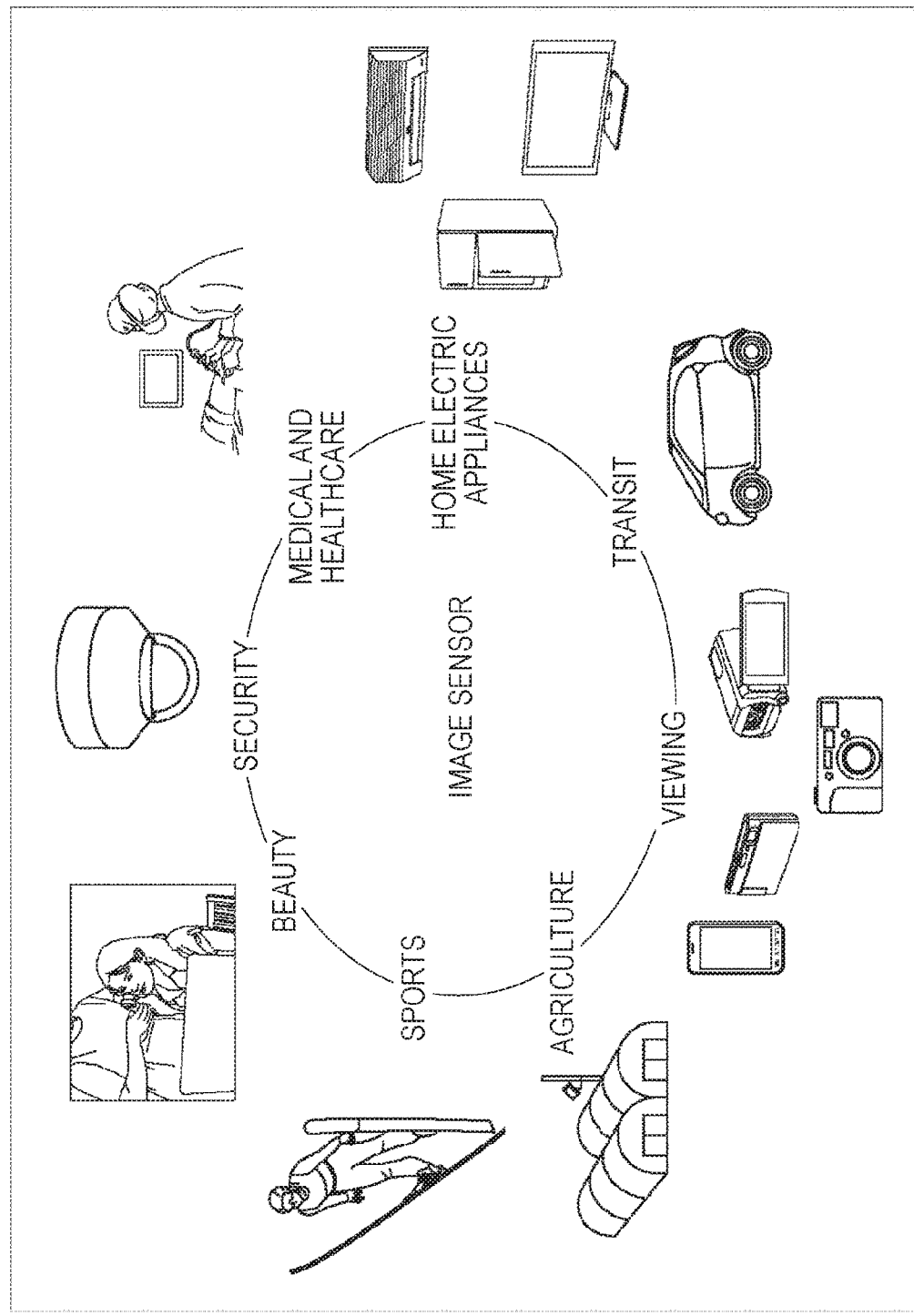
FIG. 16 is a diagram illustrating an exemplary use of a solid-state imaging device to which the technology of the present disclosure is applied.

FIG. 16 is a diagram illustrating an exemplary use of the solid-state image sensor 21 described above.

The above-described image sensor can be used in various cases for sensing light such as visible light, infrared light, ultraviolet light, an X-ray, and the like, as exemplified below.

a device for capturing an image to be used for viewing such as a digital camera and a mobile device with a camera function a device for the use of transit such as an on-vehicle sensor for capturing a front side, a rear side, surroundings, inside, and the like of a vehicle for the purpose of safe driving such as an automatic stop, recognition of a driver's condition, and the like, a monitoring camera for monitoring a traveling vehicle and a road, and a ranging sensor for measuring a distance between vehicles and the like a device for the use of home electric appliances for capturing a gesture of a user and performing device operation in accordance with the gesture such as a TV, a refrigerator, and an air conditioner a device for a healthcare and medical use such as an endoscope and a device for performing angiography based on infrared light reception a device for the use of security such as an anti-crime monitoring camera and a camera for authenticating a person a device for the use of beauty purpose such as a skin measuring device for photographing a skin and a microscope for photographing a scalp a device for the use of sports such as an action camera and a wearable camera for a sports use and the like a device for the use of agriculture such as a camera for monitoring a condition of fields and crops Note that the present disclosure can also employ the following configurations.

<1> A solid-state image sensor, in which
a step structure on a substrate surface is in a divided state.

<2> The solid-state image sensor according to <1>, in which
the step structure on the substrate surface is in a state divided into the same shape.

<3> The solid-state image sensor according to <1> or <2>, in which
the step structure in the divided state includes a gap of a predetermined width.

<4> The solid-state image sensor according to <3>, in which
the predetermined width of the gap is larger than 0.2 in a case where a size of the divided step structure in a planar direction is set to 1.

<5> The solid-state image sensor according to <3>, in which
the step structure in the divided state is geometrically disposed with the predetermined width of the gap with respect to one predetermined axial direction.

<6> The solid-state image sensor according to <5>, in which
the step structure in the divided state is geometrically disposed with the predetermined width of the gap with respect to the one predetermined axial direction in such a manner that, in a case where fluid is dropped onto the substrate surface in a state where a wafer on which a plurality of solid-state image sensors is formed is rotated so that the fluid flows on the substrate surface, fluid velocities varied by the gap due to the step structure are cancelled out as a whole.

<7> The solid-state image sensor according to <3>, in which
a plurality of the step structures in the divided state is geometrically disposed on a two-dimensional plane with the predetermined width of the gap with respect to the one predetermined axial direction.

<8> The solid-state image sensor according to <7>, in which
the plurality of step structures in the divided state is geometrically disposed on the two-dimensional plane with the predetermined width of the gap with respect to the one predetermined axial direction in such a manner that, in a case where fluid is dropped onto the substrate surface in a state where a wafer on which the plurality of solid-state image sensors is formed is rotated so that the fluid flows on the substrate surface, fluid velocities varied by the gap due to the step structure are cancelled out as a whole.

<9> The solid-state image sensor according to any one of <1> to <8>, in which
a size of the step structure in the divided state in a substrate planar direction is smaller than 100 μm.

<10> The solid-state image sensor according to any one of <1> to <9>, in which film thickness/height as a ratio between a film thickness of the fluid and a height of the substrate at a time when the fluid is dropped onto the substrate surface in the state where the wafer on which the plurality of solid-state image sensors is formed is rotated so that the fluid flows on the substrate surface is smaller than 5.

<11> A method for manufacturing a solid-state image sensor, in which
a step structure on a substrate surface is in a divided state.

<12> An imaging device, in which
a step structure on a substrate surface is in a divided state.

<13> An electronic apparatus, in which
a step structure on a substrate surface is in a divided state.

<14> A semiconductor device, in which
a step structure on a substrate surface is in a divided state.

<15> A circuit board, in which
a step structure on a substrate surface is in a divided state.

REFERENCE SIGNS LIST

11 Wafer
12 Photoresist
12a Photoresist layer
21 Solid-state image sensor
21a Imaging surface
31 Photoelectric conversion layer
32 Wiring layer
33 Logic layer
33a Metal pad
41 Electrode
51 Cavity
61, and 61-1 to 61-n Cavity
71, and 71-1 to 71-4 Wiring
91, and 91-1 to 91-4 Wiring

The invention claimed is:

1. A solid-state image sensor, comprising:
a step structure on a substrate surface, wherein
the step structure is divided into a plurality of cavities, and
a specific width of a gap between two adjacent cavities of the plurality of cavities is larger than 0.2, when a size of each cavity of the plurality of cavities in a planar direction is set to 1.

2. The solid-state image sensor according to claim 1, wherein each cavity of the plurality of cavities has a same shape.

3. The solid-state image sensor according to claim 1, wherein the plurality of cavities is geometrically arranged with respect to an axial direction.

4. The solid-state image sensor according to claim 3, wherein
the solid-state image sensor is on a wafer,
a fluid, dropped on the substrate surface when the wafer is in a rotation state, is flowable on the substrate surface, and
velocities of the fluid varied by the gap are cancelled out as a whole, on the solid-state image sensor, based on the geometrical arrangement of the plurality of cavities with the specific width of the gap.

5. The solid-state image sensor according to claim 1, wherein the plurality of cavities is geometrically arranged on a two-dimensional plane with respect to an axial direction.

6. The solid-state image sensor according to claim 5, wherein
the solid-state image sensor is on a wafer,
a fluid, dropped on the substrate surface when the wafer is in a rotation state, is flowable on the substrate surface, and
velocities of the fluid varied by the gap are cancelled out as a whole, on the solid-state image sensor, based on the geometrical arrangement of the plurality of cavities on the two-dimensional plane with the specific width of the gap.

7. The solid-state image sensor according to claim 1, wherein the size of each of the plurality of cavities in the planar direction is smaller than 100 μm.

8. The solid-state image sensor according to claim 1, wherein
the solid-state image sensor is on a wafer,
a fluid, dropped on the substrate surface when the wafer is in a rotation state, is flowable on the substrate surface, and
a ratio between a film thickness of the fluid and a height of the step structure is smaller than 5.

9. A method for manufacturing a solid-state image sensor, comprising:
forming a step structure on a substrate surface, wherein
the step structure is divided into a plurality of cavities, and
a specific width of a gap between two adjacent cavities of the plurality of cavities is larger than 0.2, when a size of each cavity of the plurality of cavities in a planar direction is set to 1.

10. An imaging device, comprising:
a step structure on a substrate surface, wherein
the step structure is divided into a plurality of cavities, and
a specific width of a gap between two adjacent cavities of the plurality of cavities is larger than 0.2, when a size of each cavity of the plurality of cavities in a planar direction is set to 1.

11. An electronic apparatus, comprising:
a step structure on a substrate surface, wherein
the step structure is divided into a plurality of cavities, and
a specific width of a gap between two adjacent cavities of the plurality of cavities is larger than 0.2, when a size of each cavity of the plurality of cavities in a planar direction is set to 1.

12. A semiconductor device, comprising:
a step structure on a substrate surface, wherein
the step structure is divided into a plurality of cavities, and
a specific width of a gap between two adjacent cavities of the plurality of cavities is larger than 0.2, when a size of each cavity of the plurality of cavities in a planar direction is set to 1.

13. A circuit board, comprising:
a step structure on a substrate surface, wherein
the step structure is divided into a plurality of cavities, and
a specific width of a gap between two adjacent cavities of the plurality of cavities is larger than 0.2, when a size of each cavity of the plurality of cavities in a planar direction is set to 1.

* * * * *